United States Patent
Meyer-Fredholm et al.

(10) Patent No.: US 6,860,942 B2
(45) Date of Patent: Mar. 1, 2005

(54) PREPARATION OF CRYSTALS

(75) Inventors: Michele M. Meyer-Fredholm, Hericy (FR); Paula J. Holmes, Sturbridge, MA (US); Qiao Li, Westborough, MA (US)

(73) Assignee: Corning Incorporated, Corning, NY (US)

( * ) Notice: Subject to any disclaimer, the term of this patent is extended or adjusted under 35 U.S.C. 154(b) by 98 days.

(21) Appl. No.: 10/454,387

(22) Filed: Jun. 3, 2003

(65) Prior Publication Data

US 2003/0217688 A1 Nov. 27, 2003

Related U.S. Application Data

(63) Continuation-in-part of application No. 10/107,283, filed on Mar. 26, 2002, now Pat. No. 6,669,778.

(51) Int. Cl.$^7$ .............................................. C30B 15/20
(52) U.S. Cl. ............................. 117/81; 117/70; 117/83
(58) Field of Search ................................ 117/70, 81, 83

(56) References Cited

U.S. PATENT DOCUMENTS 6,093,245 A    7/2000   Hammond et al. .......... 117/200

*Primary Examiner*—Felisa Hiteshew
(74) *Attorney, Agent, or Firm*—Walter M. Douglas (57) ABSTRACT

The present invention is directed to a process or method for preparing a metal fluoride pre-melt material of a quality suitable for the preparation and growth of metal fluoride optical monocrystals. The pre-melt material of the invention is prepared using permeable graphite crucibles having a permeability (porosity) greater than 4 cm$^2$/s. Exemplary monocrystals prepared from pre-melts of the invention exhibited improved transmissivity and laser durability relative to monocrystals prepared from convention pre-melt materials. Impurities in the pre-melt arising from the use of scavenger/fluorinating agent in the pre-melt have been shown to be generally less than 10 ppb and be less than 1 ppb.

18 Claims, 3 Drawing Sheets

PREPARATION OF CRYSTALS

PRIORITY

This application is a Continuation-In-Part of and claims the benefit of U.S. application Ser. No. 10/107,283, titled "Preparation of Crystals" filed Mar. 26, 2002 now U.S. Pat. No. 6,669,778; said application claiming in turn the benefit of French Application No. 01 04232, filed Mar. 29, 2001 entitled "Preparation of (mono)Crystal," by M. Meyer-Fredholm.

FIELD OF THE INVENTION

The present invention relates generally to the preparation of metal fluoride crystals, and particularly to making of optical metal fluoride crystals with improved below 200 nm wavelength optical properties. More specifically, said invention relates to a process of preparing (mono)crystals, which is improved with reference to the purity of the (mono) crystals prepared; and to a process of preparing a pre-melt suitable for the preparation of (mono)crystals that have an increased transmission in the far-ultraviolet ($\lambda<193$ nm, even $\lambda<157$ nm).

BACKGROUND OF THE INVENTION

Ultra-high performance optical systems are required in order to increase the density of integration of the electronic components on a semi-conductor plate and insofar as exposed light of low wavelength (lower than 248 nm) is necessary in order to improve the resolution. The most common technique up to now for obtaining such optical systems uses molten silica. According to another technique, which is already exploited, especially by the companies Bicron and Schott, monocrystals of calcium fluoride and monocrystals of barium fluoride are used. Ultra-high performance far-ultraviolet optical systems with below 200 nm wavelengths require fluoride optical crystals.

Said monocrystals, of calcium fluoride or of barium fluoride, and more generally of alkali metal and/or alkaline-earth metal fluorides, are in principle obtained according to the process known as the Stockbarger-Bridgman process, which is familiar to the person skilled in the art. According to said process, the crystal is generated from an appropriate molten starting material in slowly lowering (generally at a speed between 0.3 and 5 mm/h, more generally between 1 and 3 mm/h) a crucible (or a stack of crucibles) containing said molten material through a solidification zone which is provided in an oven. The crucible(s) is (are) made from a material which is resistant to chemical attack from the material that it contains. In general, it is (a) crucible(s) in graphite of high purity.

According to the teaching of US patents U.S. Pat. Nos. 5,911,824 and 6,093,245, the graphite does have the drawback of being porous (of being a material having open porosity), and it is recommended to coat the internal walls of such graphite crucibles with an appropriate internal coating, in order to <<block the porosity>> of said walls. Carbon coatings, especially pyrolytic or vitreous carbon coatings, are described.

The (mono)crystals must imperatively be prepared in the absence of water, of air and of any other source of oxygen. They are thus generally prepared under vacuum in the presence of a fluorinating agent. Said fluorinating agent ensures the elimination of oxygen, especially of that introduced in the form of oxide as impurity in the starting material. $PbF_2$ is the most utilised fluorinating agent, insofar as its manipulation does not present any particular difficulty, insofar as it is solid at ambient temperature and insofar as it has, itself and its corresponding oxide (PbO), a high vapour pressure at the temperatures of use of crystallisation ovens. Said $PbF_2$ acts, within the context of the preparation of $CaF_2$ crystals, notably according to the reaction:

$$CaO + PbF_2 \rightarrow CaF_2 + PbO.$$

In practice, it is always delicate to optimise the intervention of said fluorinating agent. It is especially critical: to adjust the rise in temperature of the mixture (for its melting) with the view to said optimisation; to adjust the amount of said fluorinating agent, with the view to minimising any retention of Pb or other fluorinating agent in question in the crystal prepared. Such a retention has obviously disadvantageous repercussions on the performances of transmission and resistance to radiation of said crystal.

In order to obtain high VUV transmission and good laser durability, metal fluoride crystals, for example, $CaF_2$ crystals, must be grown from a high purity starting material. A pretreatment of raw materials is therefore necessary to meet this purity requirement. An oxygen scavenger is also needed to remove oxygen. There exist several methods to purify the raw material, depending on which process approach (solid treatment, liquid treatment, subliming, or all combination) and which scavengers (PbF2, CF4, and ZnF2) are used. The most popular process is called pre-melting, and this process is used prior to the actual melting/cooling process used to form the optical crystal. This pre-melt process consists of mixing the CaF2 powder with some amount of scavenger in powder form, heating to a temperature above the melting point, holding at the peak temperature (liquid state) for some time to allow the scavenger to react with oxygen and other impurities and then cooling down to solidify the melt as one ingot. In addition to the purification function, the pre-melting also serves to increase capacity because it provides a more dense starting material for the growth. As a simple, effective pre-treatment process, the pre-melting has been practiced in metal fluoride business for many years. In spite of this fact, there still exist some opportunities to improve the quality of the pre-melt. One of these areas is the scavenger retention problem in the pre-melt.

It is, within the context set forth above, with reference to the optimisation of the intervention of fluorinating agents, that the present invention has been developed.

SUMMARY OF THE INVENTION

One aspect of the invention relates to a process of preparing a fluoride optical crystal which includes loading a crucible with a mixture of a fluoride optical crystal starting material which contains at least one oxide as impurity, and an effective and non-excess amount of at least one fluorinating agent which is solid at ambient temperature, melting said mixture within said crucible, growing the crystal, by controlled cooling of the molten mixture, controlled cooling of said crystal to ambient temperature, and recovering said crystal wherein the oxide(s) resulting from the reaction between said fluorinating agent(s) and said oxide(s), the impurity or impurities, can be discharged from said crucible, in view of the crucible and the intrinsic permeability of the material constituting it.

In another embodiment, the present invention includes a method of making an optical fluoride crystal with increased far-ultraviolet transmission by providing a fluoride crystal producing graphite crucible for containing the fluoride, said graphite crucible comprised of a graphite having a permeability of which, measured according to the DIN 51935 Standard, is greater than 4 cm²/s, forming a molten fluoride melt in said graphite crucible comprised of said graphite having a permeability greater than 4 cm²/s and forming a fluoride crystal from said molten fluoride melt, said formed fluoride crystal having an increased far-ultraviolet transmission with intrinsic transmission at 157 nm≧99%. In a preferred embodiment the fluoride crystal comprises calcium fluoride. In a preferred embodiment the fluoride crystal comprises barium fluoride.

In another embodiment, the present invention includes an optical fluoride crystal producing graphite crucible for making an optical fluoride crystal with increased far-ultraviolet transmission, said graphite crucible comprised of a graphite having a permeability of which, measured according to the DIN 51935 Standard, is greater than 4 cm²/s.

In another embodiment, the present invention includes a the use of a permeable (porous) graphite crucible to make a pre-melt of a metal fluoride material and a fluorinating material, also called a scavenger material, to remove oxides from the metal fluoride material and to densify it prior to its use to form a metal fluoride monocrystal by methods known in the art and/or those describes herein. The permeable graphite crucibles used in the pre-melt process have a permeability (porosity) of which, measured according to the DIN 51935 Standard, is greater than 4 cm²/s. The process for preparing a fluoride optical crystal pre-melt material suitable to manufacturing fluoride optical crystals, has a number of steps including:

loading a permeable graphite crucible with a metal fluoride compound or a mixture of metal fluoride compounds and a metal fluorinating agent;

placing the loaded crucible of step (a) into a furnace capable reaching a temperature of at least 1600° C.;

heating the mixture to a selected temperature above the melting point of the metal fluoride compound over a first selected time period;

holding the mixture of step (b) at the selected temperature for a second selected time period; and cooling the material of step (d) to room temperature over a third selected time period.

The metal of the metal fluoride compound or mixture of metal fluoride compounds is different from the metal of the metal fluorinating agent as is described elsewhere herein.

In a further embodiment the invention is directed to an pre-melt ingot, slab, disk, cylinder, or other shape of a metal fluoride compound of general formula $MF_x$, where M is potassium, rubidium, cesium, calcium, barium, magnesium, or strontium, or mixtures thereof, and x=1 or 2. The ingot of metal fluoride compound is suitable for the use in growing metal fluoride optical mono-crystals (or crystals) that can be used in a variety of optical systems, and particularly in laser systems for the transmission of laser light including its use in lithographic system. The mono-crystals of the invention exhibit improved transmissivity and durability characteristics relative to conventional mono-crystals.

Additional features and advantages of various embodiments of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION OF THE PREFERRED EMBODIMENTS

The process of preparing a crystal of the invention comprises:

loading a crucible with a mixture of the appropriate starting material which contains at least one oxide as impurity, and an effective and non-excess amount of at least one fluorinating agent which is solid at ambient temperature, melting said mixture within said crucible, growing the crystal, by controlled cooling of the molten mixture, controlled cooling of said crystal to ambient temperature, and recovering said crystal.

In this, it can be a Stockbarger-Bridgman process, or any other equivalent process, each of the steps of which is familiar to the person skilled in the art, which is thus carried out in order to obtain a mono- or polycrystalline crystal.

Thus, in order to prepare (mono)crystals of $CaF_2$, said crucible is in general loaded with a mixture de synthetic $CaF_2$ powder, which contains CaO as impurity, and $PbF_2$ (fluorinating agent).

The crucible in question can very well not be a single one. The process of the invention can effectively be carried out, just as the process of the prior art, with a stack of n crucibles, which is moved with a translatory motion along its vertical axis.

The fluorinating agent(s) which is (are) incorporated is (are) not incorporated in an excess amount. In this way, it (they) cannot pollute the crystals prepared.

Characteristically, within the context of the invention, the oxide(s) (PbO, in the context specified above (in a purely illustrative manner) of preparation of (mono)crystals of $CaF_2$) resulting from the reaction between said fluorinating agent(s) ($PbF_2$) and said oxide(s), the impurity or impurities (CaO), can be discharged from said crucible, in view of the dimensions of said crucible and of the intrinsic permeability of the material constituting it.

The crucible(s) which intervene(s) for carrying out the process of the invention is (are) optimised, as to its (their) size and its (their) intrinsic permeability, such that the crystals prepared no longer contain—in any case, less than 0.1 ppm—any element corresponding to the formulation of the fluorinating agents (element Pb, in the context specified above (in a purely illustrative manner) of preparation of (mono)crystals of $CaF_2$, with intervention of $PbF_2$ as fluorinating agent).

Within the context of the process of the invention, the fluorinating agent (even the fluorinating agents) acts (act) and leave no trace. By virtue of its (their) controlled amount of intervention (effective and non-excess amount) and the original characteristics of the crucible employed, the fluorinating agent(s) react and the reaction products can discharge totally. There is thus no pollution of the crystals prepared.

In a non-obvious manner, within a context of optimisation of the intervention of the fluorinating agent(s), the inventors:

have demonstrated that the means of implementation of the temperature rise cycle (with the view to obtaining melting of the starting material) did not constitute the determining factor of the purity (with reference to the fluorinating agent incorporated) of the crystals prepared;

have demonstrated that the purity of the material constituting the crucible was not directly responsible;

have clearly established a correlation between the intrinsic permeability of the crucible and the purity of the crystals prepared in said crucible. The more permeable the material constituting the crucible is, the less pollutant (introduced by the fluorinating agent(s) incorporated) is found in the crystals prepared. Obviously, the permeability of said crucible remains within a reasonable limit in order that the molten mixture be retained, in a stable manner, in said crucible.

The correlation established was, a priori, in no way obvious, and is entirely against the teaching of US patents U.S. Pat. Nos. 5,911,824 and 6,093,245 set forth further up in the present text.

The permeability of a porous material (in this case of the crucibles used, which are in general graphite crucibles) is a parameter which is perfectly defined by the DIN 51935 Standard: 1993-08 (entitled "Determination of the coefficient of permeability by means of the vacuum—decay method with air as experimental gas"), which is familiar to the person skilled in the art. Said permeability, which is generally expressed in $cm^2/s$, is in fact the resultant of several factors which relate to the porosity, such as:

the size of the pores, their distribution within the mass, the fact that they unblock or not in a given proportion.

Characteristically, the process of the invention thus enables very pure crystals to be prepared (less than 0.1 ppm of contaminant in general, and especially less than 0.1 ppm of Pb when $PbF_2$ is used as fluorinating agent), insofar as the discharging of the impurities, which are generated following the intervention of the fluorinating agents, is mastered perfectly. The mastering of this discharging is based jointly on the dimensions of the crucible in question (said dimensions are inevitably limited such that the vapours have the possibility of diffusing (and of being discharged) within the molten material before its crystallisation (its solidification) and on the permeability of the material constituting said crucible. The vapours in question (PbO, in the context specified above (in a purely illustrative manner) of preparation of (mono)crystals of $CaF_2$, with intervention of $PbF_2$ as fluorinating agent) diffuse within the molten material and discharge through the permeable walls of the crucible and through the surface of said molten material.

Mention has been made of the intervention of an effective and non-excess amount of at least one fluorinating agent which is solid (at ambient temperature). In general, one sole such agent intervenes. It is however in no way excluded from the context of the invention that several of them intervene.

With reference to said effective and non-excess amount, it is indicated in a totally non-limiting way that said amount is rarely greater than 5% by weight of the starting material which intervenes, that it is advantageously between 0.1 and 2% by weight of said starting material.

With reference to the nature of said fluorinating agent(s), it is specified in the same way, i.e. in a totally non-limiting manner, that said fluorinating agent(s) is (are) selected from: $PbF_2$, $ZnF_2$, $NH_4F$, $NH_4F.HF$, PTFE (polytetrafluoroethylene: Teflon®), and mixtures thereof. It has already been seen, in the introduction of the present text, that $PbF_2$ is the most used fluorinating agent up to now. Its intervention is particularly recommended within the context of the present invention.

In a preferred alternative embodiment of the invention, the high permeability graphite crucible that are comprised of graphite having a DIN Standard (DIN 51935) greater than 4 $cm^2/s$ are utilized in conjunction with a gaseous fluorinating agent such as $CF_4$. Within the context of a preferred embodiment of the process of the invention, the crucible(s) which intervene(s) is (are) graphite crucible(s) the permeability of which, measured in accordance with the DIN Standard identified above (DIN 51935), is greater than 4 $cm^2/s$. Within the context of a particularly preferred variant, said crucible(s) is (are) in a graphite, the permeability of which, in accordance with the same Standard, is greater than 10 $cm^2/s$.

Generally, the intervention is recommended, in the process of the invention, of crucibles which are suitable for preparing crystals which have the following dimensions:

200 mm diameter, for 50 mm height, 300 mm diameter, for 80 mm height.

The intervention is particularly recommended of such graphite crucibles, the permeability of which is as indicated above.

The material constituting the crucibles used is not forced to be graphite, but, obviously, said material is adapted to the constraints of the process carried out within it (presence of corrosive products, high temperatures . . . ).

In any case, the pollutant oxide(s) generated during the crystallisation within the crystallisation crucible is (are), according to the invention, capable of being discharged from said crucible, by virtue of the dimensions of said crucible and the permeability of the material constituting it (them).

The process of the invention is particularly suitable for preparing (mono)crystals of alkali metal and/or alkaline-earth metal fluorides. It enables the preparation of (mono) crystals, which are very pure, of alkali metal or alkaline-earth metal fluorides, and even the preparation of mixed (mono)crystals of fluorides of alkali metals and/or alkaline-earth metals, which are very pure, (mixtures of at least two alkali metals, of at least two alkaline-earth metals or of at least one alkali metal and at least one alkaline-earth metal).

In accordance with the invention, (mono)crystals of fluorides have been prepared of high optical quality; especially (mono)crystals of calcium and barium fluorides which have, at the wavelengths (X) indicated below, the intrinsic transmissions ($T_i$) specified below:

<193 nm, $T_i$>99.9% and

<157 nm, $T_i$>99.0%.

Such monocrystals have obvious potential in laser and lithography industries. The process of the invention is more particularly suitable for preparing (mono)crystals of calcium fluoride ($CaF_2$).

The process of the invention is advantageously carried out with a stack of crucibles, according to the Stockbarger-Bridgman method, i.e. that in its context, the controlled cooling of the molten mixture (for growing the (mono) crystals) is obtained by very slowly moving a stack of loaded crucibles from the top to the bottom, from a hot zone to a cold zone, of an oven having a vertical axis.

The process of the invention is very advantageously carried out according to the improved Stockbarger-Bridgman method, as described in the French patent application FR 00 03 771 (Mar. 24, 2000) not published as yet, i.e. with a translatory motion of the stack of loaded crucibles, continuously, the operations of loading of said crucibles being carried out without stopping the translatory motion (along the vertical axis) of the stack of crucibles.

Said process of the invention is classically carried out with starting material in the form of a powder, especially a synthetic powder (e.g. $CaF_2$). It may also advantageously be carried out with starting material which intervenes in the form of beads. Such alkali metal or alkaline-earth metal fluoride beads, their preparation and their use for preparing monocrystals are described in French patent application FR-A-2,799,194.

The person skilled in the art has understood perfectly that the presently claimed invention provides an advantage as regards the purity of the crystal prepared, that said crystal be obtained in a mono- or polycrystalline form.

The process of the invention is advantageously carried out for preparing (mono)crystals of calcium fluoride ($CaF_2$), in the presence of $PbF_2$ (fluorinating agent); said calcium fluoride (starting material) containing calcium oxide (CaO) as impurity.

Alternatively the process of the invention is advantageously carried out for preparing (mono)crystals of calcium fluoride ($CaF_2$), in the presence of $CF_4$ (gaseous fluorinating agent); said calcium fluoride (starting material) containing calcium oxide (CaO) as impurity.

This advantageous variant of implementation of the process of the invention is illustrated by the following Examples.

EXAMPLE I

The Stockbarger-Bridgman process was carried out, starting with synthetic $CaF_2$ powder, under the same conditions, in using graphite crucibles (stacks of such crucibles); the graphites (type A to D) not having the same characteristics. The characteristics in question—density, porosity, average pore diameter, permeability—are indicated in Table I below.

The crucibles used had the same geometry (cylindrical) and the same dimensions: 200 mm diameter for 50 mm height.

The process of the invention was carried out with crucibles in graphite of type C and D.

Upon completion of the implementation of the process, the crystals obtained were analysed chemically with the view to determining their lead (Pb) content.

Said lead content is indicated in said Table I below (last line).

The presence of lead, within the crystals prepared in the crucibles in graphite of type A and B, was further confirmed by examination of the absorption band at 205 nm. In the same way, the <<absence>> of lead (the absence of said absorption band) within the crystals prepared in the crucibles in graphite of type C and D was confirmed.

It emerges without ambiguity from the consideration of the values indicated in said Table I that the more the graphite is permeable, the lower the residual lead content is. The crystals obtained in the crucibles in graphite of type A and B are not acceptable (due to their residual lead content, which is too high).

These results were not foreseeable in the light of the prior art teaching.

Thus, the inventors have themselves carried out considerable experimental work before identifying the critical parameter—the intrinsic permeability of the material constituting the crucible, the dimensions of said crucible being fixed—. The inventors have especially demonstrated that the means of implementation of the heating cycle (with the view to obtaining the melting of the starting material) was not itself critical. This is the subject of the Comparative Example below.

TABLE I

| Graphite | A | B | C | D |
|---|---|---|---|---|
| Density ($g/cm^3$) | 1.745 | 1.723 | 1.704 | 1.590 |
| Porosity (Hg) (%) | 15.8 | 16.1 | 16.7 | 22.6 |
| Average pore diameter ($\mu m$) | 2.2 | 19.1 | 6 | 21 |
| Permeability ($cm^2/s$) | 0.13 | 2.6 | 4.6 | 14.7 |
| Pb content (ppm) | 1,000 to 1,500 | 5 to 20 | <0.2* | <0.2* | below the limit of detection.

EXAMPLE II

Graphite crucibles, having the dimensions indicated in Example I, of type A and C were used (in stacks) to prepare crystals according to the Stockbarger-Bridgman method. Said method was carried out with different temperature rise cycles which are specified in Table II below.

It is seen that the results, in terms of pollution (lead content of the crystals prepared), are not linked to the means of implementation of the heating, but only to the nature of the graphite constituting the crystallisation crucibles. Preferably the increased far-ultraviolet transmission fluoride optical crystal producing graphite crucible is comprised of a graphite having a permeability of which, measured according to the DIN 51935 Standard, is greater than 4 $cm^2/s$. Preferably the graphite permeability is greater than 5 $cm^2/s$, more preferably greater than 6 $cm^2/s$, more preferably greater than 7 $cm^2/s$, more preferably greater than 8 $cm^2/s$, more preferably greater than 9 $cm^2/s$, more preferably greater than 10 $cm^2/s$, more preferably greater than 11 $cm^2/s$, more preferably greater than 12 $cm^2/s$, more preferably greater than 13 $cm^2/s$, more preferably greater than 14 $cm^2/s$. Preferably the increased far-ultraviolet transmission fluoride optical crystal producing graphite crucible is comprised of a graphite having a Hg porosity of at least 16.7%, more preferably at least 17%, more preferably at least 18%, more preferably at least 19%, and more preferably a Hg porosity of at least 20%.

TABLE II

| | ① (low temperature) | ② (high temperature) |
|---|---|---|
| Temperature rise cycle | 0 to 600° C., at 50° C./h<br>600 to 800° C., at 10° C./h<br>800° C., for 12 h<br>800 to 1,100° C., at 20° C./h<br>1,100 to 1,520° C., at 50° C./h | 0 to 850° C., at 50° C./h<br>850 to 1200° C., at 30° C./h<br>1,200° C., for 12 h<br>1,200° C. to 1,520° C., at 50° C./h |
| Graphite A | Presence of lead | Presence of lead |
| Graphite C | No lead | No lead |

An additional improvement in making metal fluoride crystals can be accomplished by using a pre-melt process to purify the material used to form the metal fluoride monocrystal. Theoretically, there are many species (e.g. transition metal ions, $^-OH$ and $O^{-2}$) believed to degrade the VUV transmission of metal fluorides monocrystals, but it is very difficult to identify them due to the low concentration and the wide range of possible species. Nevertheless, oxygen in the form of OH— and $O^{-2}$, has been identified as the key contaminant that can cause VUV transmission loss and is the major impurity that needs to be removed from the crystals. In order to obtain high VUV transmission and good laser durability, metal fluoride crystals must be grown from a high purity starting material. A pretreatment of raw materials is therefore necessary to meet this purity requirement. An oxygen scavenger is also needed to remove oxygen. There exist several methods to purify the raw material, depending on which process approach (solid treatment, liquid treatment, subliming, or all combination) and which scavengers (PbF2, CF4, and ZnF2) are used. (These materials are not only scavengers, but also fluorinating agents for they replace the oxygen <<scanenged' with fluorine.)

The most popular process is called pre-melting. This process consists of mixing the metal fluoride powder with some amount of scavenger in powder form, heating to a temperature above the melting point, holding at the peak temperature (liquid state) for some time to allow the scavenger to react with oxygen and other impurities and then cooling down to solidify the melt as one ingot. This ingot is then used to make the metal fluoride monocrystal, for example, by methods taught herein and those known in the art. In addition to the purification function, the pre-melting also serves to increase capacity because it provides a more dense starting material for the crystal growth process. As a simple, effective pre-treatment process, the pre-melting has been practiced in the metal fluoride crystal growth business for many years and is used for $CaF_2$ growth. However, in spite of this fact, there still exist some opportunities to improve the quality of the pre-melt. One of these areas for is the scavenger retention problem in the pre-melt.

Instead of focusing on the process modifications to, it has been found that if a pre-melt is formed using a permeable (porous) graphite crucible and the pre-melt material is then used to form a optical metal fluoride monocrystal, the resulting crystals have a much higher transmissivity that those formed by other methods known in the art. This is believed to result from much lower levels of impurities in the pre-melt metal fluoride material than is obtained using dense graphite crucibles. The results of the test samples from the permeable graphite pre-melts were analyzed and compared with conventional (dense graphite crucible) pre-melts to show the improvement. The transmission and laser durability of crystals grown from the permeable graphite pre-melts were evaluated and compared to those grown from conventional pre-melt. It was demonstrated that permeable graphite enables not only a marked reduction in Pb and Zn retention when $PbF_2$ or $ZnF_2$ are used as scavanger/fluorinating materials (10 ppb or lower), but also the evolution of other (as yet unidentified) impurities that may impact laser durability and transmission. The pre-melt method of the invention can be used to purify any material suitable for making monocrystals. For example, $CaF_2$, $BaF_2$, KF, $SrF_2$ and other materials known in the art, including 'mixed crystals', for example, a $(CaSr)F_2$ crystal. Additional scavenger/fluorinating agents include $NH_4F$, $NH_4(HF_2)$, PTFE, and mixtures thereof.

Experiments were carried out using $PbF_2$ and $ZnF_2$ as exemplary scavengers in both dense and permeable graphite crucibles. Other scavengers known in the art can also be used in the process. Comparisons were made by measuring or estimating the concentration of retained scavenger and by measuring the VUV transmission on samples extracted from the pre-melt ingots. The results for the $PbF_2$ scavenger are shown in FIG. 1.

Figure 1:
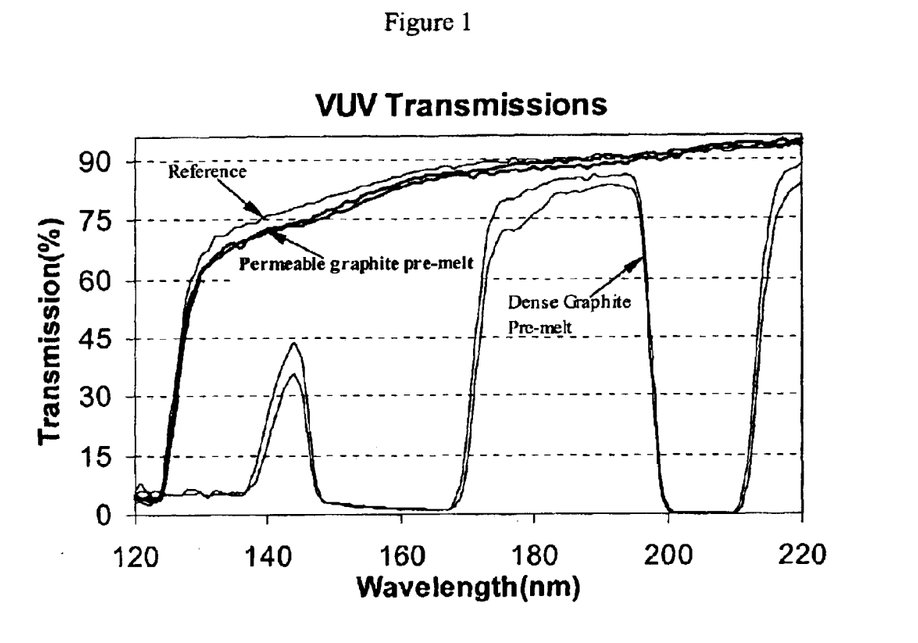
FIG. 1 illustrates the VUV transmission data for pre-melts prepared using $PbF_2$ as a scavenger/fluorinating agent and either dense or permeable graphite crucibles.

The VUV curves in FIG. 1 show no absorption peaks at 205 nm and 145 nm suggesting that the pre-melt has very little (<ppb level) lead and oxygen impurities. In contrast, the VUV curves from the dense graphite pre-melt show large absorption peaks at 155 nm and 205 nm, indicating a large amount of Pb (12 ppm) retained in the pre-melt. Although a wide Pb absorption band around 157 nm partially obscures the oxygen absorption peak at 145 nm, the very low transmission at 142 nm suggests that some oxygen still remains in the pre-melt. In addition, a transmission cut-off shown in the VUV curves from dense graphite pre-melt at a longer wavelength (137 nm) instead of shorter one (124 nm) shown in the permeable graphite pre-melt also implies the possible existence of other impurities. In conclusion, by using permeable graphite, a high purity pre-melt without Pb or O can be obtained. The results using a permeable graphite crucible for the pre-melt were compared to those obtained using a dense graphite crucible. Permeable graphite other than the one from SGL Carbon Group can also be used in practicing the invention.

Table III lists some properties of the two graphites used in the pre-melt experiments. One is a permeable graphite (R6140 from the SGL Carbon Group) and the other is non-permeable graphite (G347 from Tokai Corporation, Shiozuoka, Japan). The G347 graphite is of the type currently used for the growth and pre-melt stages, particularly in view of the disclosure of U.S. Pat. Nos. 5,911,824 and 6,093,245, that indicate the use of porous graphite materials is detrimental. It can be seen from Table III that the R6140 graphite has a much higher permeability (~37 times greater than that of G347) which gives this graphite an ability to allow impurities to diffuse out of the system through the crucible wall more readily. It should be also noted that R6140 has much lower thermal conductivity and CTE than G347, suggesting that the thermal profile in the melt/crystal might be different even under the same process conditions. It was found that as a result of these difference the the process conditions for the permeable graphite crucibles must be modified relative to those used for dense graphite crucibles.

TABLE III

Properties of Graphites from the manufacturers

| Sources | SGL Carbon | Tokai Corp. |
|---|---|---|
| Commercial Name | R6140 | G347 |
| (Forming Method) | (Iso-Molded) | (Iso-Molded) |
| Density (g/cm$^3$) | 1.59 | 1.85 |
| Permeability with $N_2$ (cm$^2$/s) | 14.7 | 0.4 |
| Porosity (%) | 22 | 13 |
| Flexural Strength (psi) | 1200 | 7110 |
| Thermal Conductivity (Btu/h · ft · ° F.) | 35 | 74 |
| CTE rt to 1600° C. ($10^{-6}$/° C.) | 3.94 | 6.67 |

Generally, permeable graphites having a permeability greater than 4 cm$^2$/s can be used in practicing the invention. Preferably the graphite permeability is greater than 5 cm$^2$/s, more preferably greater than 6 cm$^2$/s, more preferably greater than 7 cm$^2$/s, more preferably greater than 8 cm$^2$/s, more preferably greater than 9 cm$^2$/s, more preferably greater than 10 cm$^2$/s, more preferably greater than 11 cm$^2$/S, more preferably greater than 12 cm$^2$/s., more preferably greater than 13 cm$^2$/s, more preferably greater than 14 cm$^2$/s. Preferably the increased far-ultraviolet transmission fluoride optical crystal producing graphite crucible is comprised of a graphite having a Hg porosity of at least 16.7%, more preferably at least 17%, more preferably at least 18%, more preferably at least 19%, and more preferably a Hg porosity of at least 20%. Additional sources of permeable graphite materials (isostatically molded) are GraphTek LLC, (Buffalo Grove, Ill. and Ameri-Source International, Inc., Pittsburgh, Pa.

All pre-melts were prepared in one-zone, power-controlled, high temperature vacuum furnaces such as are typically used in the Bridgman crystal growth process. Generally, the furnace should be capable of heating to at least 1600° C. or, alternatively a temperature of at least 150° C. above the melting point of the metal fluoride being processed. For example, for $CaF_2$ (m.p. 1360° C. [CRC Handbook value]), the furnace should reach at least 1510° C. and for $SrF_2$ (m.p. 1450° C. [CRC handbook value]) the furnace should reach at least 1600° C.

For $CaF_2$ the typical processing conditions for pre-melting are:

heating the material/furnace above the melting temperature of the metal fluoride material by linearly increasing the power; for example, for $CaF_2$ to the PV (power value)=44 kw over 96 hours (PV=44, temperature approximately 1550±10° C.), holding at this peak temperature for 48 hours, and linearly ramping down the power to zero over 6 hours.

Once the power has been turned down to zero, the pre-melt material may either be transferred to a crucible, preferably a porous graphite crucible, for the crystal growth process (typically including the use of a seed crystal), or the pre-melt may be allowed to cool to room temperature for later use.

In a preferred embodiment for the $CaF_2$ example, a lower power value of PV=41 (1380<temperature, ° C.<1510) was used and the power was linearly reduced over 48 hours instead of 6 hours. This change was found to eliminate the formation of a very faint pink color noticed under PV=44 conditions. (The pink-tinged material may be suitable some laser and other optical uses, but is not ideal for <200 nm lasers. The color formation is believed to result from over-heating the materials in the pre-melt furnace. There is no translation of the pre-melt crucible involved in this process and the solidification is realized through the controlled cool-down. Prior experience with this pre-melt procedure using dense graphite crucibles was found to consistently produces high Pb ($\geq$30 ppm) pre-melt materials. The color can be removed by annealing (thermal bleaching) at a temperature in the range of 800° C. to approximately 1200° C. For example, two thermal bleaching experiments were carried out at 1200° C. using 100% argon and a 5/95% $CF_4$/argon atmosphere. Both experiments were successful in removing the coloration. Other inert gases such as helium, neon and nitrogen can also be used in the thermal bleaching process, both alone and in combination with a fluorine containing gas such as $CF_4$, $F_2$, $C_2F_6$ and other fluorine containing gases known in the art. When nitrogen is used it is prefreable that it be used at temperatures below 1000° C.

Using the above preferred procedure, experiments were carried out using $PbF_2$ and $ZnF_2$ as scavengers in both the dense and the permeable graphite crucibles. Comparisons were made by measuring or estimating the concentration of retained scavenger and by measuring the VUV transmission on samples extracted from the pre-melt ingots. The results for the $PbF_2$ scavenger are shown in FIG. 1. The VUV curves for the pre-melt formed in the permeable crucibles show no absorption peaks at 205 nm and 145 nm suggesting that the pre-melt has very little (<ppb level) lead and oxygen impurities. In contrast, the VUV curves from the dense graphite pre-melt show large absorption peaks at 155 nm and 205 nm, indicating a large amount of Pb (12 ppm) retained in the pre-melt from the dense graphite crucible. Although a wide Pb absorption band around 157 nm partially obscures the oxygen absorption peak at 145 nm, the very low transmission at 142 nm suggests that some oxygen still remains in the pre-melt. In addition, a transmission cut-off shown in the VUV curves from dense graphite pre-melt at a longer wavelength (137 nm) instead of shorter one (124 nm) shown in the permeable graphite pre-melt also implies the possible existence of other impurities. The data in FIG. 1 clearly indicate that by using permeable graphite a high purity pre-melt without Pb or O can be obtained.

A similar experiment was conducted using $ZnF2$ as the scavenging/fluorinating material. Pre-melt ingots were fabricated in dense and permeable graphite crucibles. Samples were taken from the center and edge areas of the ingot and the Zn concentration was determined by ICP/MS at the different locations. Table IV shows the average Zn concentration for the dense and permeable graphite crucibles. It can clearly be seen that there is much less Zn retained in the pre-melt when the permeable graphite is used.

TABLE IV

Zinc Retention in Pre-Melt Ingots

| | Average (ppm) |
| --- | --- |
| Run A (dense) | 119.00 |
| Run B (dense) | 193.3 |
| Run C (dense) | 165 |
| Run D (dense) | 72 |
| Run E (permeable) | 0.1 or less |

Figure 2:
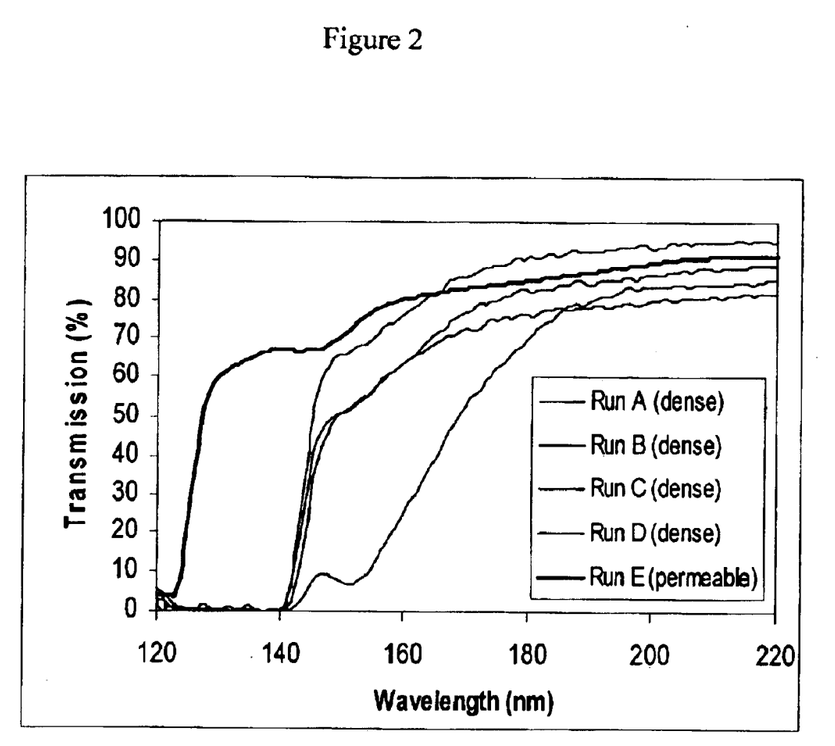
FIG. 2 illustrates the VUV transmission data for pre-melts prepared using $ZnF_2$ as a scavenger/fluorinating agent and either dense or permeable graphite crucibles.

Transmission samples were extracted from the center of the pre-melts and evaluated. The VUV data in FIG. 2 shows significant absorption across much of the wavelength range for the first run in dense graphite. Subsequent runs showed improved transmission but a clear cut-off at 140 nm remained for all dense graphite pre-melts. In contrast, the transmission for the permeable graphite pre-melt is much improved. Even though there is some absorption around 145 nm, which is may be due to residual oxygen, the overall transmission is generally higher and the cut-off wavelength has shifted down to around 120 nm.

The laser durability of the $ZnF2$ samples was evaluated using a specific test protocol. Table V shows the dramatic improvement in the durability when the permeable graphite crucible is used.

TABLE V

Laser Durability Results for $ZnF_2$ Pre-Melt Experiments

| | Fluence DependentTransmission | |
| --- | --- | --- |
| | $\Delta T_1$ | $\Delta T_2$ |
| Run A (dense) | 0.977 | 2.610 |
| Run B (dense) | 0.584 | 2.521 |
| Run C (dense) | 0.373 | 2.959 |
| Run D (dense) | 0.485 | 2.543 |
| Run E (permeable) | 0.016 | 0.294 |

$\Delta T_1$: Recovery measure after exposure to high fluence.
$\Delta T_2$: Drop in transmission due to high fluence exposure.

To further elucidate the impact of the permeable graphite pre-melt on the optical properties (especially transmission and laser damage) of $CaF_2$ crystals, TLD test results were compared from four growth runs in which $CaF_2$ monocrystals wwere prepares using premets prepared with the PbF2 scavenger: Monocrystals were prepared using two permeable graphite pre-melt materials (Run#1 and Run#2) and two dense graphite pre-melt materials (Ref#1 and Ref#2). The single crystals from the foregoing permeable graphite prepared premelts were prepared using dense graphite crucibles in order to further illustrate the value of the present invention wherein the premelts are prepared using with permeable graphit crucibles. Single crystals from premelts prepared using dense craphite crucibles were likewise grown using dense graphite crucibles. The data in Tavle VI thus provides strong evidence for theutility of using permeable graphite crucibles to prepare the premelts.

Figure 3:
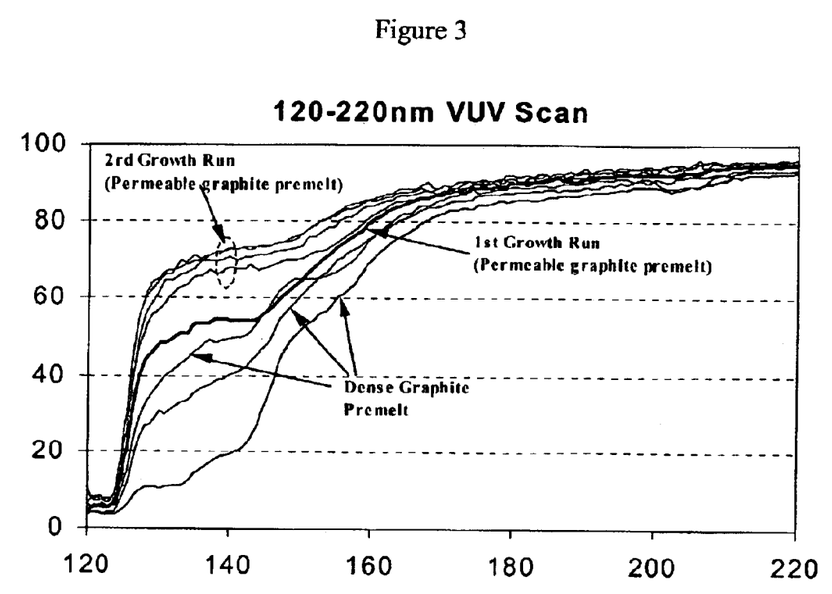
FIG. 3 illustrates the 120–220 nm VUV transmission data for optical crystals made using pre-melts prepared in dense graphite crucibles and permeable graphite crucibles.

As can be seen from the date in Table VI, the crystals grown from permeable graphite pre-melts show higher transmission at 193 nm and 157 nm than the crystals grown hose grown from dense graphite crucible pre-melt. The VUV curves shown in FIG. 3 confirmed this observation. In terms of laser durability, an even more dramatic improvement can be seen from two types of laser tests on the samples that were grown from the permeable graphite pre-melt. The data leads to the conclusion that the permeable graphite pre-melt yields both better transmission and laser damage resistance than the standard pre-melt generated from dense graphite.

Crystals made of materials other than $CaF_2$ can be made to show similar improvements. The exact conditions for each type of materials will vary with regard to maximum temperature required and the length of time to maintain the molten materials at peak temperature. For materials with melting points similar to that of $CaF_2$ (m.p. 1360° C.) the conditions will be similar to those of $CaF_2$ [for example, $BaF_2$ (m.p. 1280° C.), $MgF_2$ (m.p. 1266° C.) and $SrF_2$ (m.p. 1450° C.)]. For a material such as KF (m.p. 846° C.), lower temperatures will be required and cool-down to room temperature can occur more quickly. Generally, the maximum or peak temperature during the pre-melt process should be in the range of 20–150° C. greater than the literature melting point of the fluoride material, and should also be sufficiently high to allow for volitalization of the scavanger reaction products. Further, one must make certain that the scavanger/fluorinating materials used in the process melts (if a solid) under process conditions or interacts with the metal fluoride, and that its reaction products are volatile or otherwise mobile. Consequently, pre-melting of materials that melt at lower temperatures that the alkaline metal fluorides, for example, KF (m.p. 846° C.) would require the use of a scavanger other than $PbF_2$ or $ZnF_2$. Suitable materials might be $F_2$, $CF_4$, $NH_4F$, $NH_4(HF_2)$, PTFE, mixtures thereof, and other materials known in the art.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

TABLE VI

TLD Results For $CaF_2$ Monocrystals Grown After Using $PbF_2$ Scavenger

| Growth run # | Start Materials | Ingot# | 193 nm Ti(%/cm) | 205 nm Ti(%/cm) | 157 nm Ti(%/cm) | LD Test1 K_0 | LD Test1 K_ind | LD Test2 ΔT5 | LD Test2 ΔT30 |
|---|---|---|---|---|---|---|---|---|---|
| Ref#1 | Dense | 1 | 99.29 | 98.72 | 92.61 | | | 0.065 | 0.23 |
| | Graphite | 2 | 99.47 | 99.60 | 93.88 | | | 0.018 | 0.24 |
| | Premelt | 3 | 99.63 | 99.76 | 94.99 | | | 0.016 | 0.222 |
| Run#1 | Permeable | 1 | 99.79 | 99.08 | 93.19 | | | 0.021 | 0.279 |
| | Graphite | 2 | 99.90 | 99.53 | 95.84 | 6.07E−04 | 5.01E−05 | 0.016 | 0.211 |
| | Premelt | 3 | 99.92 | 99.95 | 96.71 | 3.63E−04 | 5.26E−05 | 0.014 | 0.193 |
| Ref#2 | Dense | 1 | 99.89 | 87.79 | 73.94 | 5.90E−04 | 1.10E−04 | 0.038 | 0.54 |
| | Graphite | 2 | 99.74 | 98.18 | 92.79 | 1.51E−03 | 1.29E−04 | 0.034 | 0.646 |
| | Premelt | 3 | 99.95 | 99.98 | 97.49 | 5.75E−04 | 1.20E−04 | 0.044 | 0.585 |
| Run#2 | Permeable | 1 | 99.75 | 99.49 | 96.51 | 5.11E−04 | 5.10E−05 | 0.028 | 0.24 |
| | Graphite | 2 | 99.91 | 99.91 | 98.28 | 4.56E−04 | 4.25E−05 | 0.031 | 0.264 |
| | Premelt | 3 | 99.92 | 99.94 | 97.92 | 3.16E−04 | 4.58E−05 | 0.006 | 0.235 |
| | | 4 | 99.90 | 99.94 | 98.67 | 2.10E−04 | 2.98E−05 | 0.027 | 0.274 |

What is claimed is:

1. A process for preparing a fluoride optical crystal pre-melt material suitable to manufacturing fluoride optical crystals, said process comprising:
    (a) loading a permeable graphite crucible with a metal fluoride compound or a mixture of metal fluoride compounds and a metal fluorinating agent;
    (b) placing the loaded crucible of step (a) into a furnace capable reaching a temperature of at least 1600° C.;
    (c) heating the mixture to a selected temperature above the melting point of the metal fluoride compound over a first selected time period;
    (d) holding the mixture of step (b) at the selected temperature for a second selected time period; and
    (e) cooling the material of step (d) to room temperature over a third selected time period;
    wherein the metal of the metal fluoride compound or mixture of metal fluoride compounds is different from the metal of the metal fluorinating agent.

2. The process according to claim 1, wherein the selected temperature is in the range of 20–150° C. above the melting point of the metal fluoride compound and the first selected time is in the range of 80–120 hours.

3. The process according to claim 1, wherein the second selected time for holding the material at the selected temperature is in the range of 36–60 hours.

4. The process according to claim 1, wherein the third selected time for the cooling to room temperature is in the range of 5–120 hours.

5. The process according to claim 1, wherein the metal fluoride compound is of general formula $MF_x$, and M is selected from the group consisting of calcium, barium, strontium, potassium and magnesium, and mixtures thereof, and x is 1 or 2.

6. The process according to claim 1, wherein the metal fluorinating agent is selected from the group consisting of $PbF_2$, $ZnF_2$, $NH_4F$, $NH_4(HF_2)$, PTFE, and mixtures thereof.

7. The process according to claim 6, wherein the metal fluorinating agent is selected from the group consisting of $PbF_2$ and $ZnF_2$, and mixtures thereof.

8. The process according to claim 6, wherein the amount of fluorinating agent is in the range of 0.1% to represents 5% by weight of the metal fluoride compound.

9. The process according to claim 6, wherein the amount of fluorinating agent is in the range of 0.1% to r 2% by weight of the metal fluoride compound.

10. The process according to claim 1, wherein the permeable graphite crucible has a permeability greater than 4 $cm^2/s$.

11. The process according to claim 1, wherein the permeable graphite crucible has a permeability greater than 10 $cm^2/s$.

12. The process according to claim 1, wherein the permeable graphite crucible has a permeability greater than 10 $cm^2/s$.

13. A process for preparing a fluoride optical crystal pre-melt material suitable to manufacturing fluoride optical crystals, said process comprising:

(a) loading a permeable graphite crucible with a metal fluoride compound of formula $MF_2$, or a mixture of said metal fluoride compounds, and a metal fluorinating agent selected from the group consisting of $PbF_2$ and $ZnF_2$;

(b) placing the loaded crucible of step (a) into a furnace capable reaching a temperature in the of at least 1600° C.;

(c) heating the mixture to a selected temperature in the range of 20–150° C. above the melting point of the metal fluoride compound over a first selected time period;

(d) holding the mixture of step (b) at the selected temperature for a second selected time period; and (e) cooling the material of step (d) to room temperature over a third selected time period;

wherein the metal M of the metal fluoride compound or mixture of metal fluoride compounds is different from the metal of the metal fluorinating agent, and wherein M is selected from the group consisting of calcium, barium, magnesium and strontium.

14. The process according to claim 13, wherein the selected metal fluoride is $CaF_2$ the first selected temperature is in the range of 1380–1530° C. and the first selected time is in the range of 80–120 hours.

15. The process according to claim 13 wherein the second selected time for holding the material at the selected temperature is in the range of 80–120 hours.

16. The process according to claim 14 wherein the third selected time for the cooling to room temperature is in the range of 36–120 hours.

17. The process according to claim 13, wherein the amount of fluorinating agent is in the range of 0.1% to represents 5% by weight of the metal fluoride compound.

18. The process according to claim 13, wherein the amount of fluorinating agent is in the range of 0.1% to r 2% by weight of the metal fluoride compound.

* * * * *

UNITED STATES PATENT AND TRADEMARK OFFICE
CERTIFICATE OF CORRECTION

PATENT NO. : 6,860,942 B2
DATED : June 3, 2003
INVENTOR(S) : Michele Meyer-Fredholm et al.

It is certified that error appears in the above-identified patent and that said Letters Patent is hereby corrected as shown below:

Column 15,
Line 25, Claim 12 should be claim 18 - Claim 12 duplicates claim 11
Currently it reads: "The process according to claim 1 wherein the permeable graphite crucible has a permeability greater than 10 $cm^2/s$." should read:
-- The process according to claim 13 wherein the permeable graphite crucible has a permeability greater than 10 $cm^2/s$. --

Signed and Sealed this

Thirty-first Day of May, 2005

JON W. DUDAS
*Director of the United States Patent and Trademark Office*